US012776480B2

(12) United States Patent
Matsumoto et al.

(10) Patent No.: US 12,776,480 B2
(45) Date of Patent: Oct. 27, 2026

(54) LOWER ELECTRODE MECHANISM AND SUBSTRATE PROCESSING METHOD

(71) Applicant: Tokyo Electron Limited, Tokyo (JP)

(72) Inventors: Naoki Matsumoto, Miyagi (JP); Mitsunori Ohata, Miyagi (JP); Masataka Masuyama, Miyagi (JP); Naoki Mihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 376 days.

(21) Appl. No.: 18/383,619

(22) Filed: Oct. 25, 2023

(65) Prior Publication Data

US 2024/0071734 A1 Feb. 29, 2024

Related U.S. Application Data

(63) Continuation of application No. PCT/JP2022/018219, filed on Apr. 19, 2022.

(30) Foreign Application Priority Data

Apr. 26, 2021 (JP) ................................ 2021-074286

(51) Int. Cl.
*H01J 37/32* (2006.01)

(52) U.S. Cl.
CPC .. *H01J 37/32724* (2013.01); *H01J 37/32174* (2013.01); *H01J 37/32568* (2013.01)

(58) Field of Classification Search
CPC ........... H01J 37/32724; H01J 37/32174; H01J 37/32568; H01J 37/32715; H01J 37/32091; C23C 16/46; C23C 16/505; C23C 16/4586; C23C 16/509; H02N 13/00; H10P 14/29; H10P 50/242; H10P 72/70; H10P 72/0432; H10P 72/722; H10P 72/7616; H10P 72/7624; H05B 6/02; H05B 6/36; H05B 6/105; H05B 6/365; H05B 6/362;
(Continued)

(56) References Cited

U.S. PATENT DOCUMENTS 6,481,368 B1 * 11/2002 Lofgren .............. F27D 99/0006 156/345.52
7,985,295 B1 * 7/2011 Tompa ................ C23C 16/4586 118/725
(Continued)

FOREIGN PATENT DOCUMENTS

JP 2010-232476 A 10/2010
JP 2015-173027 A 10/2015
(Continued)

*Primary Examiner* — Rudy Zervigon
(74) *Attorney, Agent, or Firm* — Nath, Goldberg & Meyer; Jerald L. Meyer; Tanya E. Harkins

(57) ABSTRACT

There is provided a lower electrode mechanism for plasma processing, the lower electrode mechanism including: a base portion to which radio-frequency power is applied during the plasma processing; a dielectric portion disposed at an upper surface of the base portion; and an induction heating mechanism, in which the induction heating mechanism includes an induction heating element heated by an induction magnetic field, and a magnetic field generator that is disposed inside the base portion and generates the induction magnetic field.

20 Claims, 13 Drawing Sheets

(58) Field of Classification Search
CPC ...... H05B 6/104; H05B 6/102; H05B 6/1209; H05B 6/10; H05B 2213/07; H05B 6/44
USPC ........ 118/728; 156/345.51, 345.52; 219/647, 219/660
See application file for complete search history.

(56) References Cited

U.S. PATENT DOCUMENTS

| | | | |
|---|---|---|---|
| 2005/0011441 A1* | 1/2005 | Kannan ............. | C23C 16/45527 118/715 |
| 2010/0059182 A1 | 3/2010 | Lee et al. | |
| 2019/0198363 A1* | 6/2019 | Shimai ................... | H05B 6/105 |
| 2021/0166964 A1* | 6/2021 | Harashima ............ | C23C 16/325 |

FOREIGN PATENT DOCUMENTS

| | | | |
|---|---|---|---|
| JP | 2018-186179 | A | 11/2018 |
| KR | 10-2010-0032819 | A | 3/2010 |
| KR | 10-2019-0003837 | A | 1/2019 |
| WO | 2009-011015 | A1 | 1/2009 |
| WO | 2019-171948 | A1 | 9/2019 |

* cited by examiner

LOWER ELECTRODE MECHANISM AND SUBSTRATE PROCESSING METHOD

CROSS-REFERENCE TO RELATED APPLICATION

This application is a bypass continuation application of international application No. PCT/JP2022/018219 having an international filing date of Apr. 19, 2022 and designating the United States, the international application being based upon and claiming the benefit of priority from Japanese Patent Application No. 2021-074286, filed on Apr. 26, 2021, the entire contents of which are incorporated herein by reference.

TECHNICAL FIELD

The present disclosure relates to a lower electrode mechanism and a substrate processing method.

BACKGROUND

Patent Document 1 discloses a plasma processing apparatus that includes a heater power supply electrically connected to, via a heater power feed line, a heating element provided in a stage supporting an object, and attenuates or prevents, by a filter provided on the heater power feed line, high frequency noise entering the heater power feed line from the heating element toward the heater power supply.

PRIOR ART DOCUMENT

Patent Document

Patent Document 1: Japanese Laid-Open Patent Publication No. 2015-173027

SUMMARY

A technique according to the present disclosure provides a lower electrode mechanism capable of generating heat wirelessly with a heating element provided in an electrostatic chuck that sucks and holds a substrate.

According to one aspect of the present disclosure, there is provided a lower electrode mechanism for plasma processing, the lower electrode mechanism including: a base portion to which radio-frequency power is applied during the plasma processing; a dielectric portion disposed at an upper surface of the base portion; and an induction heating mechanism, in which the induction heating mechanism includes an induction heating element heated by an induction magnetic field, and a magnetic field generator that is disposed inside the base portion and generates the induction magnetic field.

According to the present disclosure, it is possible to provide a lower electrode mechanism capable of generating heat wirelessly with a heating element provided in an electrostatic chuck that sucks and holds a substrate.

DETAILED DESCRIPTION

Figure 1:
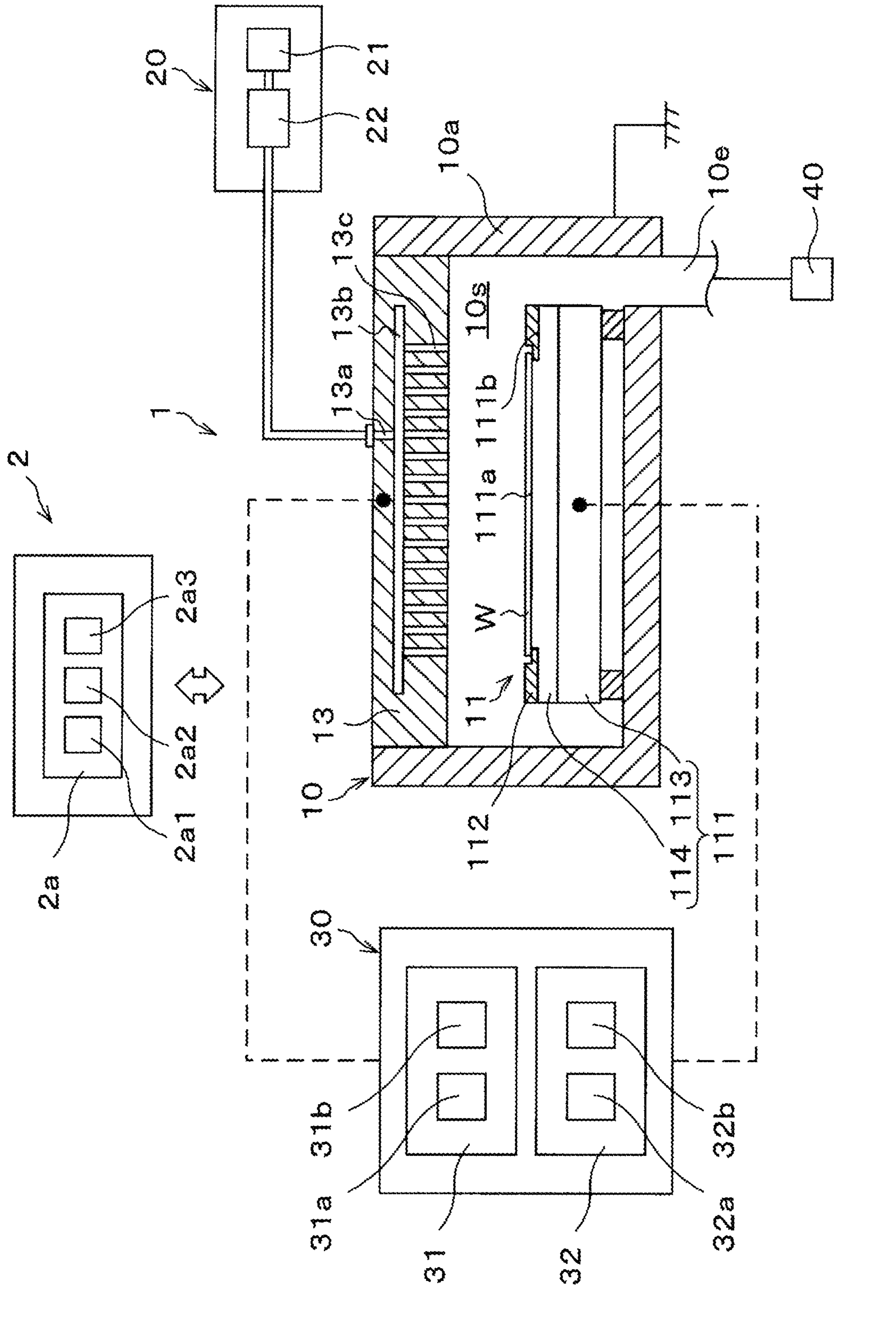
FIG. 1 is a vertical sectional view illustrating a configuration example of a plasma processing system according to the present embodiment.

In a process of manufacturing a semiconductor device, various types of plasma processing such as an etching process, a film formation process, and a diffusion process are performed on a semiconductor substrate (hereinafter, simply referred to as "substrate") supported by a substrate support by exciting a processing gas supplied into a chamber to generate plasma. The substrate support that supports the substrate is provided with an electrostatic chuck that sucks and holds the substrate on a placing surface by, for example, a Coulomb force or the like.

In the plasma processing described above, in order to improve a uniformity of process characteristics with respect to the substrate, it is required to appropriately adjust temperature distribution of a substrate to be processed. The temperature distribution of the substrate during the plasma processing is adjusted, for example, by adjusting a surface temperature of the electrostatic chuck and correcting a heat transfer distribution from the electrostatic chuck.

In a case where the temperature distribution of the substrate is adjusted by adjusting the surface temperature of the electrostatic chuck as described above, a plurality of heating elements (for example, heaters) are provided inside the electrostatic chuck, and the surface temperature of the substrate is adjusted for each of a plurality of temperature control regions defined by the heating elements. Meanwhile, in a case where the plurality of heating elements are provided inside the electrostatic chuck in this manner, power feeding cables corresponding to the number of temperature control regions described above are required, and there is a problem in which a lower space of the electrostatic chuck is occupied by these power feeding cables.

Further, in the power feeding cable connected to the heating element, some of radio-frequency waves applied from a radio frequency (RF) power source to the substrate support enter as common mode noise when plasma is generated, so that an abnormal discharge or a backflow of radio-frequency power may occur. In order to remove such a noise component from the power feeding cable, for example, it is necessary to provide an RF cut filter on the power feeding cable. Meanwhile, in a case where the RF cut filter is provided in this manner, the lower space of the electrostatic chuck is further occupied. In particular, since it is necessary to make a coil of the RF cut filter larger, that is, higher impedance, as the RF becomes lower, the problem of occupying the lower space of the electrostatic chuck becomes conspicuous.

Further, since the RF cut filter has frequency characteristics, in order to appropriately remove the noise component from the power feeding cable, it is necessary to select the RF cut filter according to a frequency of the applied RF power, and to optimize a removal capability of the noise component. Meanwhile, in recent plasma processing, since RF powers of different frequencies are applied according to the process of the plasma processing, it is very difficult to remove all the noise components by the single RF cut filter. In other words, in order to appropriately remove the noise component, it is necessary to provide a plurality of RF cut filters on the power feeding cable, and the problem of occupying the lower space of the electrostatic chuck becomes more conspicuous.

Patent Document 1 discloses a plasma processing apparatus in which an RF cut filter (filter unit) for attenuating or preventing such noise components (radio-frequency noise) is provided on a power feeding cable (line) of a heating element. Meanwhile, Patent Document 1 does not describe the fact that a lower space of an electrostatic chuck is occupied by the power feeding cable or the RF cut filter as described above, and thus there is room for improvement in this respect.

The present disclosure is made in consideration of the circumstances described above, and provides a lower electrode mechanism capable of generating heat wirelessly with a heating element provided in an electrostatic chuck that sucks and holds a substrate. Hereinafter, a plasma processing system provided with a substrate support serving as a lower electrode mechanism according to the present embodiment will be described with reference to the drawings. The same reference numerals will be given to elements having substantially the same functional configurations throughout the specification and the drawings, and redundant description thereof will be omitted.

<Plasma Processing Apparatus>

First, a plasma processing system according to the present embodiment will be described. FIG. 1 is a vertical sectional view illustrating a configuration of the plasma processing system according to the present embodiment.

The plasma processing system includes a capacitively-coupled plasma processing apparatus 1 and a controller 2. A plasma processing apparatus 1 includes a plasma processing chamber 10, a gas supply 20, a power source 30, and an exhaust system 40. Further, the plasma processing apparatus 1 includes a substrate support 11 and a gas introduction unit. The substrate support 11 is disposed inside the plasma processing chamber 10. The gas introduction unit is configured to introduce at least one processing gas into the plasma processing chamber 10. The gas introduction unit includes a shower head 13. The shower head 13 is disposed above the substrate support 11. In one embodiment, the shower head 13 constitutes at least a part of a ceiling of the plasma processing chamber 10. A plasma processing space 10*s* defined by the shower head 13, a sidewall 10*a* of the plasma processing chamber 10, and the substrate support 11 is formed in the plasma processing chamber 10. The plasma processing chamber 10 has at least one gas supply port for supplying at least one processing gas into the plasma processing space 10*s*, and at least one gas exhaust port for exhausting the gas from the plasma processing space 10*s*. The sidewall 10*a* is grounded. The shower head 13 and the substrate support 11 are electrically insulated from the plasma processing chamber 10.

The substrate support 11 includes a main body member 111 serving as a lower electrode mechanism and a ring assembly 112. An upper surface of the body member 111 has a central region 111*a* (a substrate support surface) for supporting a substrate (wafer) W, and an annular region 111*b* (a ring support surface) for supporting the ring assembly 112. The annular region 111*b* surrounds the central region 111*a* in a plan view. The ring assembly 112 includes one or more annular members, and at least one of the one or more annular members is an edge ring.

Figure 2:
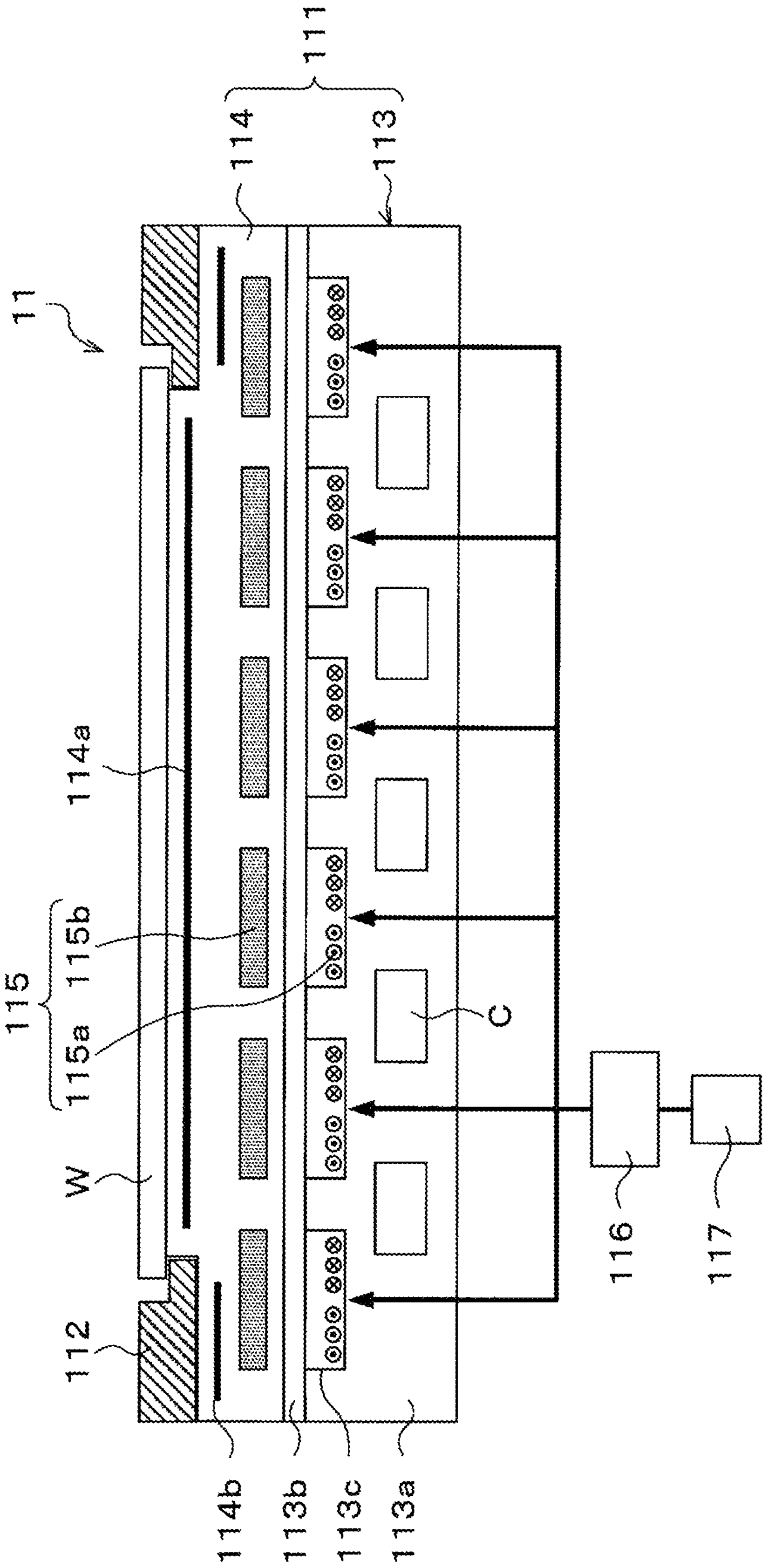
FIG. 2 is a vertical sectional view illustrating a configuration example of a substrate support according to the present embodiment.

As illustrated in FIG. 2, in one embodiment, the main body member 111 includes a base 113 and an electrostatic chuck 114 serving as a dielectric portion. In one embodiment, the base 113 includes a main body member 113*a* and a lid member 113*b*. The main body member 113*a* and the lid member 113*b* are stacked and joined to each other via an adhesive member (not illustrated).

The main body member 113*a* is made of, for example, a nonmagnetic conductive member such as an Al alloy. The conductive member of the main body member 113*a* functions as a lower electrode. A recess portion 113*c* is formed at an upper surface of the main body member 113*a*, which is a surface to which the lid member 113*b* is joined. An induction heating (IH) coil 115*a* to be described later is disposed in the recess portion 113*c*.

Further, a flow path C is formed in the main body member 113*a*. A heat transfer medium (a temperature control fluid) from a chiller unit (not illustrated) is circulated and supplied in the flow path C. Then, by causing the heat transfer medium to circulate in the flow path C, the temperature of the ring assembly 112, the electrostatic chuck 114 to be described later, and the substrate W is adjusted to a desired temperature. As the heat transfer medium, for example, a coolant such as cooling water can be used.

Although FIG. 2 illustrates, as an example, a case where the flow path C is formed at a lower portion of the central region 111*a* (substrate W) of the main body member 113*a*, the flow path C may be further formed at a lower portion of the annular region 111*b* corresponding to the ring assembly 112.

In the same manner as the main body member 113*a*, the lid member 113*b* is made of a nonmagnetic conductive member such as an Al alloy. The lid member 113*b* is formed in, for example, a disk shape having substantially the same diameter as the main body member 113*a*, and is joined to the upper surface of the main body member 113*a* to close the recess portion 113*c* formed in the main body member 113*a*. In other words, the lid member 113*b* may function as a ceiling surface of the recess portion 113*c* formed in the main body member 113*a*.

The base 113 functions as a casing that accommodates the induction heating coil 115*a* to be described later in the base 113, and reduces invasion of radio-frequency waves from an RF power source 31 to be described later into the induction heating coil 115*a*. In this respect, the lid member 113*b* is desirably formed to have a thickness such that an induction magnetic field M from the induction heating coil 115*a* to be described later passes through the lid member 113*b*, and the radio-frequency waves from the RF power source 31 do not pass through the lid member 113*b*. More specifically, it is preferable that the lid member 113*b* has a thickness larger than or equal to a skin depth at a frequency of the radio-frequency wave from the RF power source 31 to block the radio-frequency wave.

The electrostatic chuck 114 is stacked and joined to an upper surface of the base 113 (more specifically, the lid member 113*b*) via, for example, an adhesive member (not illustrated). An upper surface of the electrostatic chuck 114 has the central region 111*a* and the annular region 111*b* described above. A first electrode 114*a* for sucking and holding the substrate W and a second electrode 114*b* for sucking and holding the ring assembly 112 are provided in the electrostatic chuck 114. Further, a magnetic substance 115*b* to be described later is provided in the electrostatic chuck 114. The electrostatic chuck 114 is configured, for example, by interposing the first electrode 114*a*, the second electrode 114*b*, and the magnetic substance 115*b* between a pair of dielectric films made of a nonmagnetic dielectric such as ceramic.

FIG. 2 is a view illustrating, as an example, a case where the central region 111*a* for holding the substrate W on the upper surface of the electrostatic chuck 114 and the annular region 111*b* for holding the ring assembly 112 on the upper surface of the electrostatic chuck 114 are integrally configured. Meanwhile, the configuration of the electrostatic chuck 114 is not limited thereto, and the central region 111*a* and the annular region 111*b* of the electrostatic chuck 114 may be independently configured. The central region 111*a* and the annular region 111*b* are configured independently of each other in this manner, so that the substrate W and the ring assembly 112 can be thermally separated from each other, and the temperature adjustment can be performed independently of each other.

Further, as illustrated in FIG. 2, a heating mechanism 115 serving as an induction heating mechanism that heats at least one of the ring assembly 112, the electrostatic chuck 114, and the substrate W is provided in the substrate support 11. The heating mechanism 115 includes a plurality of induction heating coils 115*a* disposed in the recess portion 113*c* of the main body member 113*a*, and a plurality of magnetic substances 115*b* disposed in the electrostatic chuck 114 corresponding to the induction heating coils 115*a*, respectively.

Figure 3:
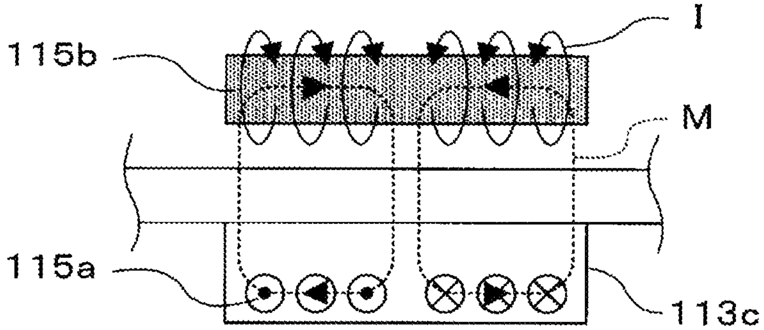
FIG. 3 is an explanatory diagram illustrating an operating principle of a heating mechanism.

A heating power source 117 is connected to the induction heating coil 115*a* serving as a magnetic field generator via an inverter circuit 116. The induction heating coil 115*a* generates the induction magnetic field M inside the base 113 as illustrated in FIG. 3 by receiving power from the heating power source 117.

The inverter circuit 116 controls a frequency of the power applied from the heating power source 117 to the induction heating coil 115*a*. Specifically, for example, an alternating current 50/60 Hz from the heating power source 117 is converted into a radio-frequency wave of several tens of kHz or more (for example, 100 kHz to 2 MHz). As the heating power source 117, any alternating current (AC) power source, for example, a general commercial AC power source can be used. As illustrated in FIG. 2, only one inverter circuit 116 and heating power source 117 may be connected to the substrate support 11, or a plurality of inverter circuits 116 and heating power sources 117 may be provided, for example, for each temperature control region for adjusting an in-plane temperature of the substrate W.

The magnetic substance 115*b* serving as an induction heating element is made of, for example, a metal material having magnetism (for example, a material containing iron such as carbon steel, silicon iron, stainless steel, permalloy, and ferrite). As illustrated in FIG. 3, an induction current I (eddy current) is induced at a surface of the magnetic substance 115*b* by the induction magnetic field M generated from the induction heating coil 115*a*. The magnetic substance 115*b* generates Joule heat according to a resistance value of the magnetic substance 115*b* by the induction current I. Further, induction magnetic flux generated from the induction heating coil 115*a* generates heat by a hysteresis loss (loss caused by friction between molecules of Fe) generated in the magnetic substance 115*b*.

The induction heating element may not be a metal material having magnetism as long as the induction heating element is a material capable of generating sufficient heat by Joule heat generation caused by the eddy current. For example, aluminum, tungsten, tin, titanium, carbon, silicon, or silicon carbide may be used.

Here, in the heating mechanism 115, in order to appropriately heat the magnetic substance 115*b* by the induction magnetic field M emitted from the induction heating coil 115*a*, it is necessary to dispose the magnetic substance 115*b* in a range in which the induction magnetic field M from the induction heating coil 115*a* is received inside the electrostatic chuck 114.

Figure 4:
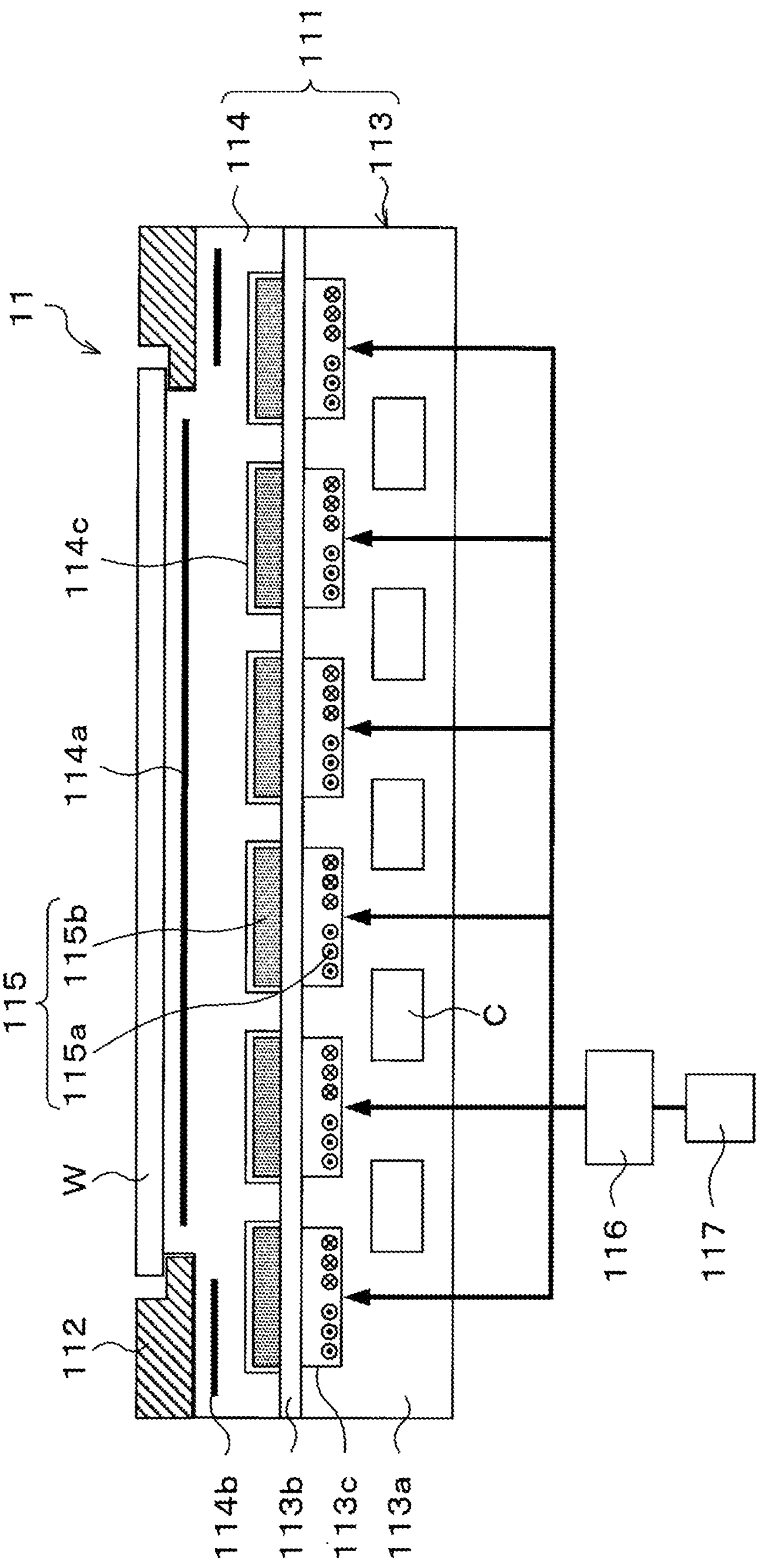
FIG. 4 is a vertical sectional view illustrating a configuration example of a substrate support according to another embodiment.

Therefore, with the substrate support according to the present embodiment, it is preferable to dispose the magnetic substance 115*b* below the electrostatic chuck 114 (on a side of the base 113) as much as possible to reduce a distance between the induction heating coil 115*a* and the magnetic substance 115*b*. Further, for example, as illustrated in FIG. 4, a recess portion 114*c* may be formed at a lower surface of the electrostatic chuck 114, and the magnetic substance 115*b* may be disposed inside the recess portion 114*c*. In other words, the magnetic substance 115*b* may be disposed on the upper surface of the base 113 (more specifically, the lid member 113*b*).

Further, instead of or in addition to making the distance between the induction heating coil 115*a* and the magnetic substance 115*b* small, a core member made of a material having a high magnetic permeability may be provided in the induction heating coil 115*a* to strengthen the induction magnetic field M emitted from the induction heating coil 115*a*.

Figure 5:
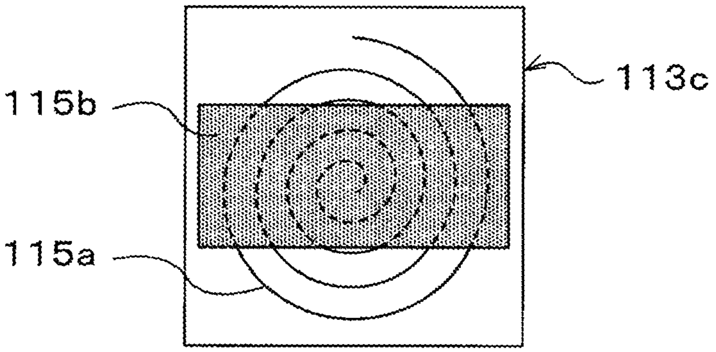
FIG. 5 is a schematic cross-sectional diagram illustrating a disposition example of the heating mechanism.
Figure 6:
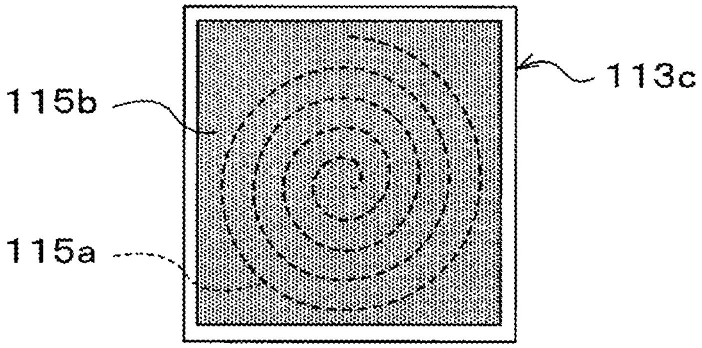
FIG. 6 is a schematic cross-sectional diagram illustrating another disposition example of the heating mechanism.

Further, as illustrated in FIG. 5, in order to appropriately apply the induction magnetic field M emitted from the induction heating coil 115*a* to the magnetic substance 115*b*, the induction heating coil 115*a* and the magnetic substance 115*b* are disposed such that at least parts of the induction heating coil 115*a* and the magnetic substance 115*b* overlap with each other in a plan view, preferably, such that an entire surface of the induction heating coil 115*a* overlaps with the magnetic substance 115*b* as illustrated in FIG. 6. When the induction heating coil 115*a* and the magnetic substance 115*b* are disposed to overlap with each other in this manner, the induction magnetic field M emitted from the induction heating coil 115*a* can be caused to act on the magnetic substance 115*b* appropriately, so that the magnetic substance 115*b* can generate heat. Further, when the induction heating coil 115*a* and the magnetic substance 115*b* are disposed such that the entire surface of the induction heating coil 115*a* overlaps with the magnetic substance 115*b* as illustrated in FIG. 6, the induction magnetic field M emitted at least upward from the induction heating coil 115*a* can be used for induction heating without leaking.

As described above, with the plasma processing apparatus 1, in order to improve a uniformity of process characteristics with respect to the substrate W, it is required to appropriately adjust an in-plane temperature distribution of the substrate W during the plasma processing. In other words, it is required that the in-plane temperature of the substrate W is configured to adjust independently for each of the plurality of temperature control regions.

Figure 7:
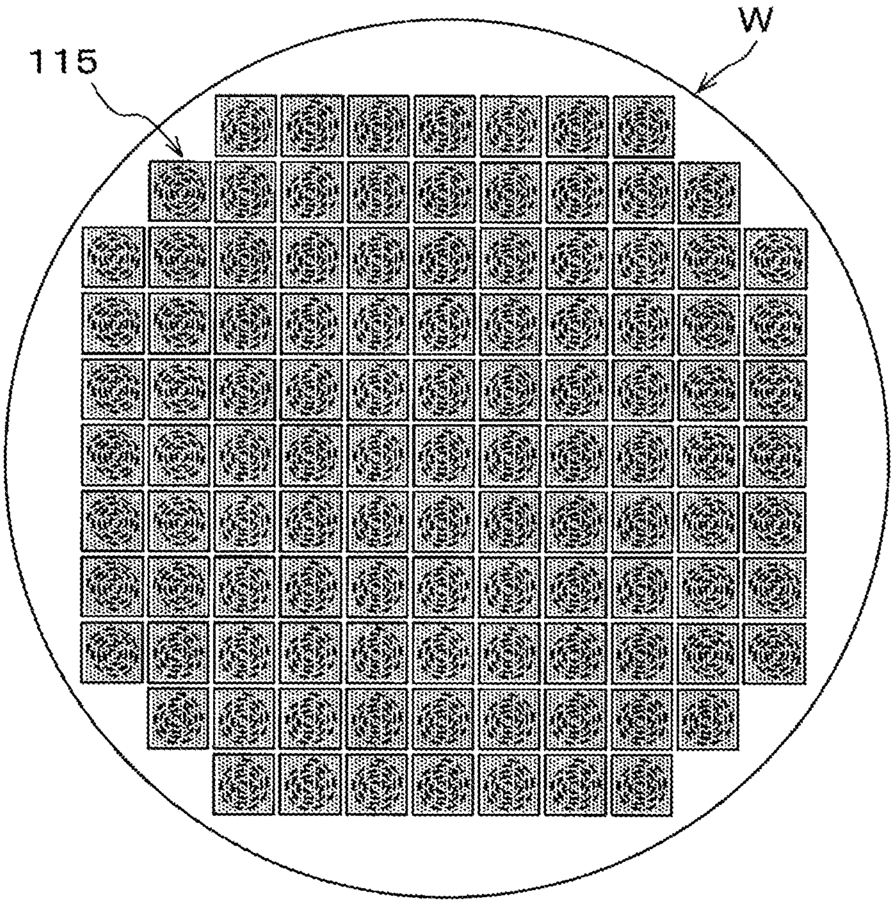
FIG. 7 is a schematic cross-sectional diagram illustrating a disposition example of the heating mechanism with respect to the substrate support.

Therefore, as described above, the plurality of induction heating coils 115*a* and the plurality of magnetic substances 115*b* are respectively provided inside the substrate support 11 according to the present embodiment. Specifically, as illustrated in FIG. 7, the plurality of induction heating coils 115*a* and magnetic substance 115*b* are provided inside the substrate support 11 at a desired interval from each other. In this manner, by providing the plurality of induction heating coils 115*a* and magnetic substances 115*b* inside the substrate support 11 and adjusting the frequency of the radio-frequency power applied to each induction heating coil 115*a* (or each temperature control region formed with a group of the induction heating coils 115*a*) by the inverter circuit 116, a surface temperature (in-plane temperature of the substrate W) distribution of the electrostatic chuck 114 can be appropriately adjusted.

Further, from the viewpoint of appropriately adjusting the in-plane temperature distribution of the substrate W, a movable mechanism may be further provided which causes a part of the magnetic field generator to come close to or separate from the induction heating element. Specifically, for example, as illustrated in FIG. 8, an actuator 120 may be connected to a central portion of the induction heating coil 115*a*.

The induction heating coil 115*a* is covered with an insulator film 119 such as a polyimide film, and the actuator 120 and the induction heating coil 115*a* are insulated from each other. The actuator 120 may be made of an insulator such as quartz, and insulated from the induction heating coil 115*a*. A distal end of the actuator 120 is bonded to the insulator film 119, and a part of the induction heating coil 115*a* (the central portion of the induction heating coil 115*a* in the example illustrated in FIG. 9) comes close to or is separated from the induction heating element (the magnetic substance 115*b*) by the driving of the actuator 120.

When the part (central portion) of the induction heating coil 115*a* is brought close to the magnetic substance 115*b*, a close portion (central portion) of the magnetic substance 115*b* is heated more strongly than a distant portion (end portion) of the magnetic substance 115*b*. Meanwhile, since the part (central portion) of the induction heating coil 115*a* is separated from the magnetic substance 115*b*, the distant portion (central portion) of the magnetic substance 115*b* is heated less strongly than the close portion (end portion) of the magnetic substance 115*b*.

Figure 8:
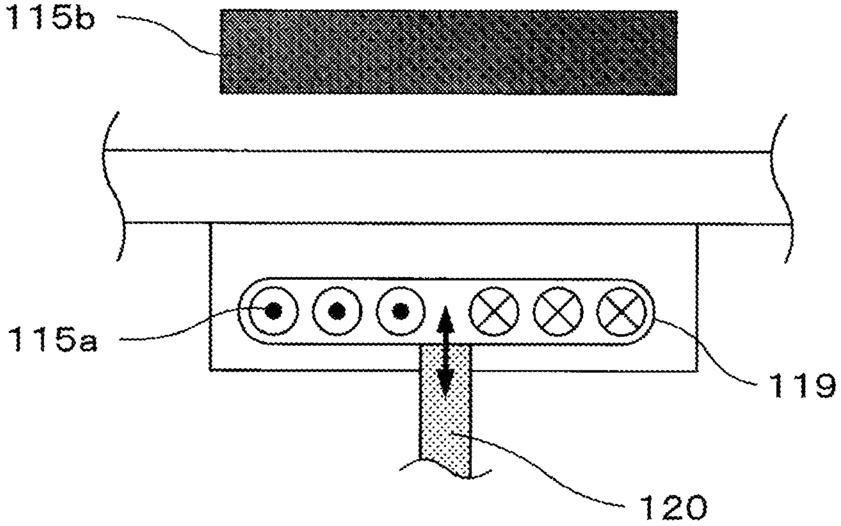
FIG. 8 is a vertical sectional view illustrating another configuration example of the heating mechanism.
Figure 9:
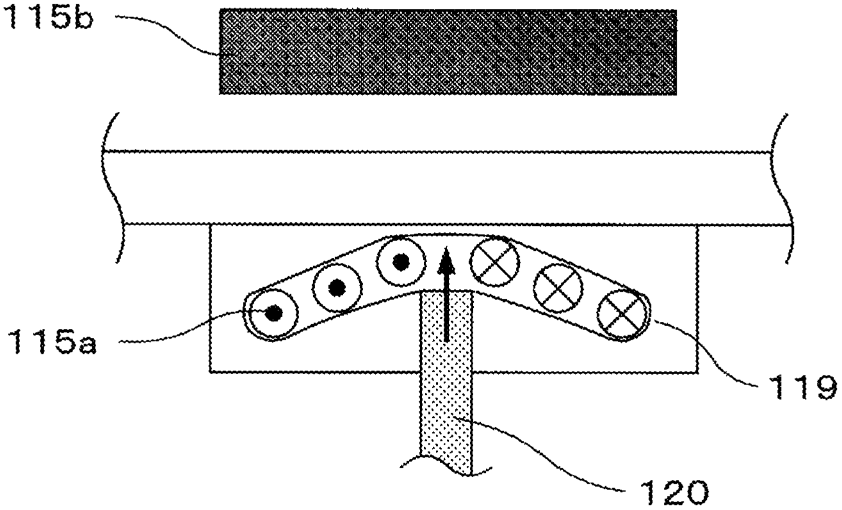
FIG. 9 is an explanatory diagram illustrating an operation example of the heating mechanism illustrated in FIG. 8.

Therefore, by providing a movable mechanism that causes a part of the magnetic field generator to come close to or separate from the induction heating element, the temperature distribution control of the induction heating element (the magnetic substance 115*b* in the examples illustrated in FIGS. 8 and 9) can be performed. As illustrated in FIG. 7, in a case of providing a plurality of magnetic field generators, each of all the magnetic field generators may be provided with a movable mechanism, or only some of the magnetic field generators may be provided with movable mechanisms. Further, the movable mechanism may be provided for each temperature control region formed with a group of magnetic field generators, or for only a part of the temperature control region formed by the group of magnetic field generators.

In this manner, with the substrate support 11 of the present embodiment, the magnetic substance 115*b* provided inside the electrostatic chuck 114 can inductively generate heat wirelessly by using the induction magnetic field M emitted from the induction heating coil 115*a*, without being electrically connected to the induction heating coil 115*a* provided inside the main body member 113*a*. That is, in the electrostatic chuck in the related art, the number of power feeding cables connecting the heating element and the power source is reduced, and the lower space of the electrostatic chuck 114 is prevented from being occupied by these power feeding cables. Further, since the power feeding cables can be reduced in this manner, the RF cut filter provided along with the power feeding cable can be further reduced, and the occupation of the lower space of the electrostatic chuck 114 can be further reduced.

In the present embodiment, no other member having magnetism except for the magnetic substance 115*b* is provided inside the electrostatic chuck 114, and the electrostatic chuck 114 itself is also made of a nonmagnetic dielectric such as ceramic. Therefore, the induction magnetic field M generated from the induction heating coil 115*a* can cause only the magnetic substance 115*b*, which is a heating element, to selectively generate heat.

Although not illustrated, the substrate support 11 may include a heat transfer gas supply configured to supply a heat transfer gas (a backside gas) between a rear surface of the substrate W and the upper surface of the electrostatic chuck 114.

Referring back to FIG. 2, the shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied from the gas supply 20 to the gas supply port 13*a* passes through the gas diffusion chamber 13*b* and is introduced into the plasma processing space 10*s* from the gas introduction ports 13*c*. Further, the shower head 13 includes a conductive member. The conductive member of the shower head 13 functions as an upper electrode. In addition to the shower head 13, the gas introduction unit may include one or more side gas injectors (SGI) that are attached to one or more openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to the plasma processing chamber 10 via at least one impedance matching circuit. The RF power source 31 is configured to supply at least one RF signal (RF power), such as a source RF signal and a bias RF signal, to a conductive member (the lower electrode) of the substrate support 11 and/or a conductive member (the upper electrode) of the shower head 13. Accordingly, plasma is formed from at least one processing gas supplied into the plasma processing space 10*s*. Accordingly, the RF power source 31 may function as at least a part of a plasma generator configured to generate plasma from one or more processing gases in the plasma processing chamber 10. In addition, by supplying the bias RF signal to the lower electrode, a bias potential can be generated in the substrate W to draw an ion component in the formed plasma to the substrate W.

In one embodiment, the RF power source 31 includes a first RF generator 31*a* and a second RF generator 31*b*. The first RF generator 31*a* is configured to be coupled to the lower electrode and/or the upper electrode via at least one impedance matching circuit, and generate the source RF signal (source RF power) for plasma generation. In one embodiment, the source RF signal has a frequency in a range of 13 MHz to 150 MHz. In one embodiment, the first RF generator 31*a* may be configured to generate a plurality of source RF signals having different frequencies. The generated one or plurality of source RF signals are supplied to the lower electrode and/or the upper electrode. The second RF generator 31*b* is coupled to the lower electrode via at least one impedance matching circuit, and is configured to generate the bias RF signal (bias RF power). In one embodiment, the bias RF signal has a lower frequency than that of the source RF signal. In one embodiment, the bias RF signal has a frequency within a range of 400 kHz to 13.56 MHz. In one embodiment, the second RF generator 31*b* may be configured to generate a plurality of bias RF signals having different frequencies. The generated one or the plurality of bias RF signals are supplied to the lower electrode. In addition, in various embodiments, at least one of the source RF signal and the bias RF signal may be pulsed.

As described above, in the related art, the bias RF signal supplied from the RF power source 31 to the lower electrode may enter the power feeding cable that connects the heating element (for example, a heater or the like) and the power source for the heating element as common mode noise. In this respect, in the present embodiment, as described above, the magnetic substance 115*b* generates heat wirelessly without providing the power feeding cable in the heating mechanism 115. Therefore, no noise enters the power feeding cable.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is configured to be connected to the lower electrode and generate a first DC signal. The generated first bias DC signal is applied to the lower electrode. In one embodiment, the first DC signal may be applied to another electrode, such as an adsorption electrode inside the electrostatic chuck 114. In one embodiment, the second DC generator 32*b* is configured to be connected to the upper electrode and generate a second DC signal. The generated second DC signal is applied to the upper electrode. In various embodiments, at least one of the first and second DC signals may be pulsed. The first and second DC generators 32*a* and 32*b* may be provided in addition to the RF power source 31, and the first DC generator 32*a* may be provided instead of the second RF generator 31*b*.

The exhaust system 40 may be connected to, for example, a gas exhaust port 10*e* disposed at a bottom portion of the plasma processing chamber 10. The exhaust system 40 may include a pressure adjusting valve and a vacuum pump. A pressure inside the plasma processing space 10*s* is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2*a*. The computer 2*a* may include, for example, a processor (central processing unit (CPU)) 2*a*1, a storage unit 2*a*2, and a communication interface 2*a*3. The processor 2*a*1 may be configured to perform various control operations based on a program stored in the storage unit 2*a*2. The storage unit 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 through a communication line such as a local area network (LAN).

While various exemplary embodiments have been described above, various additions, omissions, substitutions and changes may be made without being limited to the exemplary embodiments described above. Indeed, the embodiments described herein may be embodied in a variety of other forms.

For example, the present embodiment has been described by taking a case where the plasma processing system includes the plasma processing apparatus 1 of capacitively-coupled plasma (CCP) as an example. Meanwhile, the configuration of the plasma processing system is not limited thereto. For example, the plasma processing system may include a processing apparatus that includes a plasma generator of inductively coupled plasma (ICP), electron-cyclotron-resonance plasma (ECR plasma), helicon wave plasma (HWP), a surface wave plasma (SWP), and the like. Further, a processing apparatus including various types of plasma generators including an alternating current (AC) plasma generator and a direct current (DC) plasma generator may be used.

Figure 10:
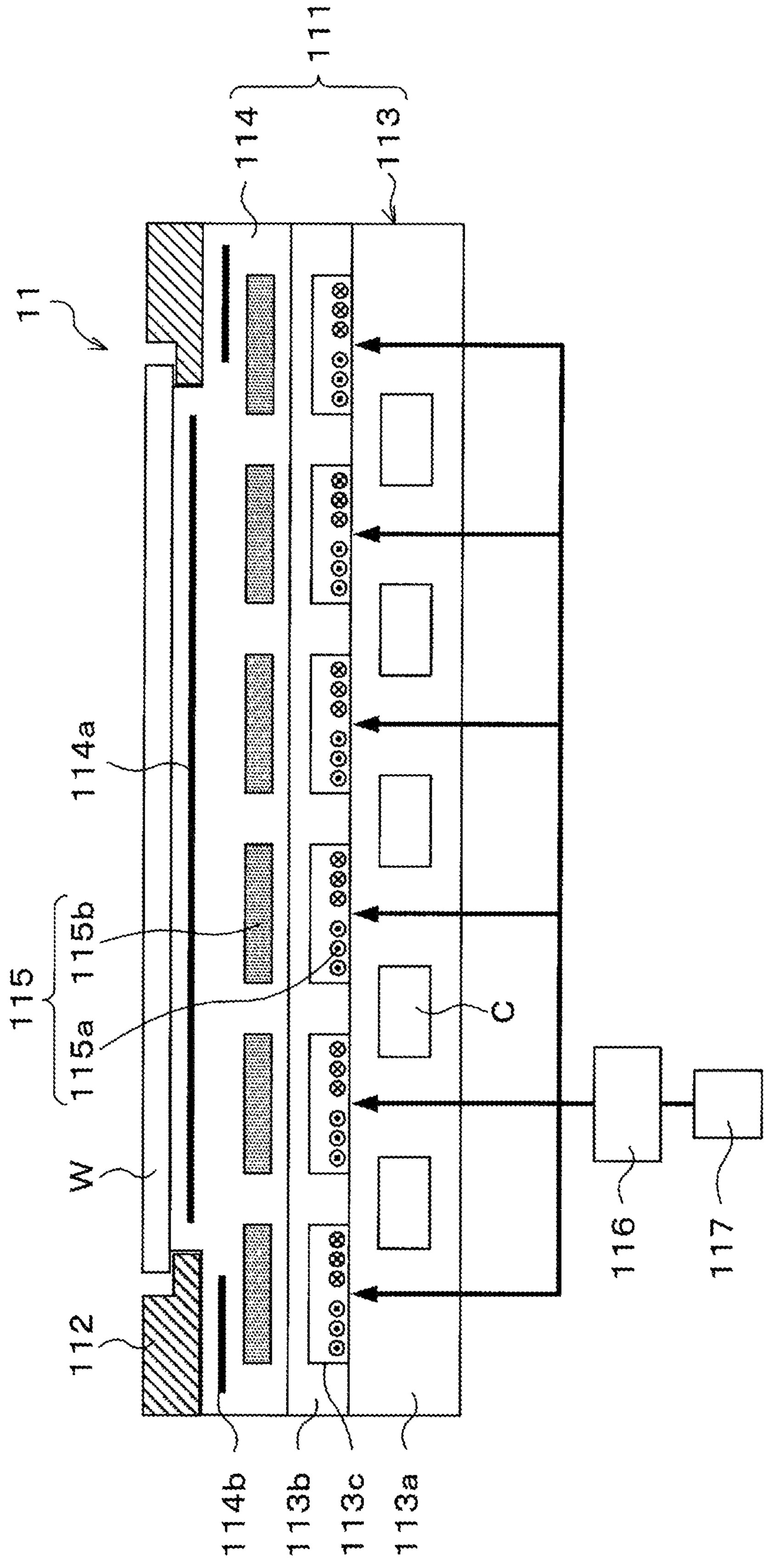
FIG. 10 is a vertical sectional view illustrating a configuration example of a substrate support according to another embodiment.

Further, for example, in the present embodiment, a case where the recess portion 113*c* is formed at the upper surface of the main body member 113*a* of the substrate support 11 and the induction heating coil 115*a* is disposed inside the recess portion 113*c* as illustrated in FIG. 2 is described by way of example. Meanwhile, the configuration of the substrate support 11 is not limited thereto. Specifically, as illustrated in FIG. 10, instead of the upper surface of the main body member 113*a*, the recess portion 113*c* may be formed at a lower surface of the lid member 113*b*, and the induction heating coil 115*a* may be disposed inside the recess portion 113*c*.

Further, in the above embodiment, the main body member 113*a* and the lid member 113*b* of the substrate support 11 are separately provided. Meanwhile, the main body member 113*a* and the lid member 113*b* may be integrally configured.

<Processing Method of Substrate by Plasma Processing Apparatus>

Next, an example of the processing method of the substrate W in the plasma processing apparatus 1 configured as above will be described. With the plasma processing apparatus 1, any plasma processing such as an etching process, a film formation process, and a diffusion process according to purposes is performed on the substrate W.

First, the substrate W is loaded into the plasma processing chamber 10, and the substrate W is placed on the electrostatic chuck 114 of the substrate support 11. Next, a voltage is applied to the first electrode 114*a* of the electrostatic chuck 114, and thus the substrate W is sucked and held onto the electrostatic chuck 114 by electrostatic power.

The plasma processing according to purposes is executed on the substrate W sucked and held onto the electrostatic chuck 114 while an in-plane temperature distribution is adjusted by the operation of the heating mechanism 115 provided inside the substrate support 11. Specifically, the plasma processing is performed while the magnetic substance 115*b* is heated by applying a radio-frequency power from the heating power source 117 to the induction heating coil 115*a* to generate the induction magnetic field M and inducing the induction current I (eddy current) on the surface of the magnetic substance 115*b* with the induction magnetic field M, for example, and the surface temperature of the substrate support 11 (the electrostatic chuck 114) on which the substrate W is supported is adjusted.

A method of adjusting the temperature with the heating mechanism 115 will be described in more detail.

During the plasma processing of the substrate W in the plasma processing apparatus 1 by the heating mechanism 115, the surface temperature distribution of the substrate W is measured over time by a temperature sensor (not illustrated). Further, a target surface temperature of the substrate W during the plasma processing is output in advance to the controller 2, for example, according to a processing result or a surface condition with respect to the substrate W in the preceding step.

Therefore, in the plasma processing according to the present embodiment, the amount of current (the frequency of the radio-frequency power) to be supplied to the induction heating coil 115*a* is adjusted (feedback control) by the inverter circuit 116, according to a difference between the surface temperature of the substrate W measured by the temperature sensor (not illustrated) and the target temperature of the substrate W that is output in advance to the controller 2. A correlation between the current and the temperature, that is, the supply amount of the current to the induction heating coil 115*a* necessary for correcting a difference value between the target temperature and the measured temperature, is obtained in advance by any method and is output to the controller 2.

The correction of the difference value between the target temperature and the measured temperature is performed for each induction heating coil 115*a* (or the temperature control region formed by the group of induction heating coils 115*a*) as described above, so that the entire surface of the substrate W can be appropriately adjusted to have the target temperature.

The correlation between the current and the temperature described above may be changed, due to, for example, individual differences, temporal deterioration, or the like between the heating mechanism 115, a temperature sensor (not illustrated), and other members. Therefore, in order to correct the influence of such temporal deterioration or the like, it is preferable to appropriately correct the correlation between the current and the temperature at a time of start-up or maintenance of the plasma processing apparatus 1.

A timing for starting the adjustment of the surface temperature of the substrate support 11 (the electrostatic chuck 114) is not particularly limited, and the temperature adjustment may be started after the substrate W is sucked and held onto the electrostatic chuck 114, or may be started before the substrate W is sucked and held.

When the substrate W is sucked and held onto the electrostatic chuck 114, the inside of the plasma processing chamber 10 is then decompressed to a predetermined vacuum level. Next, the processing gas is supplied from the gas supply 20 to the plasma processing space 10*s* via the shower head 13. Further, the source RF power for plasma generation is supplied from the first RF generator 31*a* to the lower electrode, and thus the processing gas is excited to generate plasma. At this time, the bias RF power may be supplied from the second RF generator 31*b*. In the plasma processing space 10*s*, the plasma processing according to purposes is executed on the substrate W by the action of the generated plasma.

When the plasma processing is ended, the supply of the source RF power from the first RF generator 31*a* and the supply of the processing gas from the gas supply 20 are stopped. In a case where the bias RF power is supplied during the plasma processing, the supply of the bias RF power is also stopped.

Next, the temperature adjustment of the substrate W by the heating mechanism 115 and the sucking and holding of the substrate W by the electrostatic chuck 114 are stopped, and static elimination of the substrate W and the electrostatic chuck 114 after the plasma processing is performed. Thereafter, the substrate W is detached from the electrostatic chuck 114, and the substrate W is unloaded from the plasma processing apparatus 1. In this way, a series of plasma processing is completed.

<Action and Effects of Substrate Support According to Present Disclosure>

As described above, according to the substrate support 11 according to the present embodiment, the heating mechanism 115 that adjusts the temperature of the substrate W is configured with the induction heating coil 115*a* and the magnetic substance 115*b*, so that the magnetic substance 115*b* serving as a heating element can generate heat wirelessly by the induction magnetic field M emitted from the induction heating coil 115*a*.

That is, unlike in the related art, it is not necessary to connect the power feeding cable to the magnetic substance 115*b*, and the number of power feeding cables disposed in the lower space of the substrate support 11 (the electrostatic chuck 114) can be significantly reduced, so that the occupation of the lower space can be reduced and the lower space can be effectively used.

Further, with the present embodiment, since it is not necessary to connect the power feeding cable to the magnetic substance 115*b* in this manner, the RF cut filter provided along with the power feeding cable in the related art can be further omitted. Accordingly, it is possible to further reduce the occupation of the lower space of the substrate support 11 (the electrostatic chuck 114).

Further, since the RF cut filter has frequency characteristics, in the related art, in a case where RF powers of different frequencies are applied from the RF power source to the substrate support 11, it is necessary to provide a plurality of RF cut filters to remove noise components of different frequencies, respectively. Meanwhile, in the present embodiment, even in a case where the RF powers of different frequencies are applied to the substrate support 11, the power feeding cable is omitted, and therefore, it is not necessary to provide the RF cut filter.

Further, in the above embodiment, the induction heating coil 115*a* is disposed inside the recess portion 113*c* formed at the base 113 made of, for example, an Al alloy or the like. Further, an upper portion of the recess portion 113*c* is closed by the lid member 113*b* made of, for example, an Al alloy or the like. In other words, the base 113 functions as a casing that accommodates the induction heating coil 115*a*. Accordingly, it is appropriately reduced that the radio-frequency waves applied from the RF power source 31 to the substrate support 11 enter the induction heating coil 115*a* as noise components, that is, the occurrence of abnormal discharge or the backflow of the radio-frequency power in the heating mechanism 115 is reduced.

Further, with the present embodiment, the surface temperature (in-plane temperature of the substrate W) distribution of the electrostatic chuck 114 can be appropriately adjusted, by disposing the induction heating coils 115*a* and the magnetic substances 115*b* inside the substrate support 11 and adjusting the frequency of the radio-frequency power applied to each induction heating coil 115*a* (or the temperature control region formed by the group of induction heating coils 115*a*), as illustrated in FIG. 7.

In a case where the induction heating coils 115*a* are disposed side by side at the substrate support 11 in this manner, the induction magnetic fields M emitted from the induction heating coils 115*a* adjacent to each other may interfere with each other, so the magnetic substances 115*b* corresponding to each induction heating coil 115*a* may not be appropriately heated.

Therefore, in order to reduce the interference of the induction magnetic field M, a magnetic shield 118 that reflects and absorbs the induction magnetic field M may be provided around the induction heating coil 115*a*. As the magnetic shield 118, a plate-shaped member of a relative magnetic permeability $\mu > 1$, for example, stainless steel, can preferably be selected.

Figure 11:
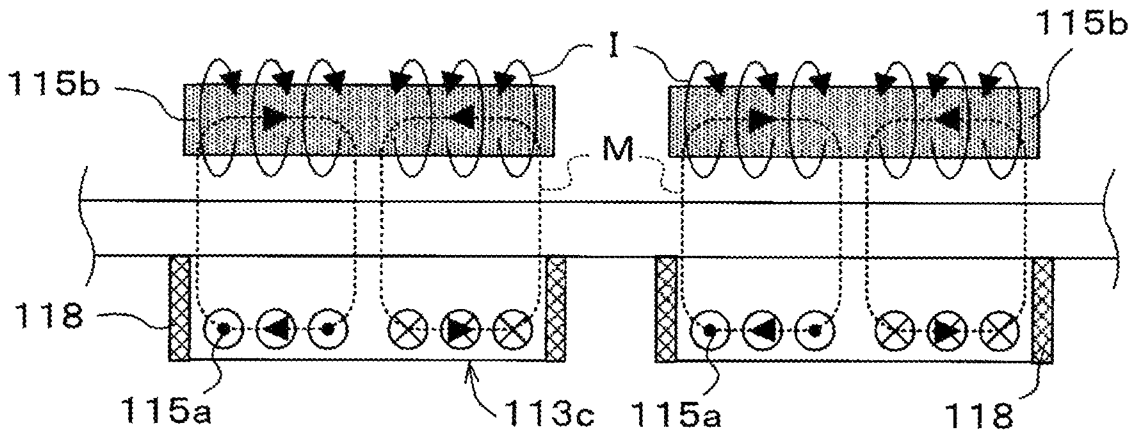
FIG. 11 is a vertical sectional view illustrating still another configuration example of the heating mechanism.

FIG. 11 is an explanatory diagram illustrating an installation example of the magnetic shield 118. As illustrated in FIG. 11, the magnetic shield 118 is formed to be larger than at least the induction heating coil 115*a* in a height direction, along a sidewall surface of the recess portion 113*c* of the base 113. In other words, the magnetic shield 118 is disposed such that an upper tip position of the magnetic shield 118 is higher than an upper tip position of the induction heating coil 115*a*. Accordingly, it is possible to reduce the induction magnetic field M emitted from the induction heating coil 115*a* from leaking in an adjacent direction, reduce the interference of the induction magnetic field M, and appropriately heat the magnetic substance 115*b* (the substrate W).

Figure 12:
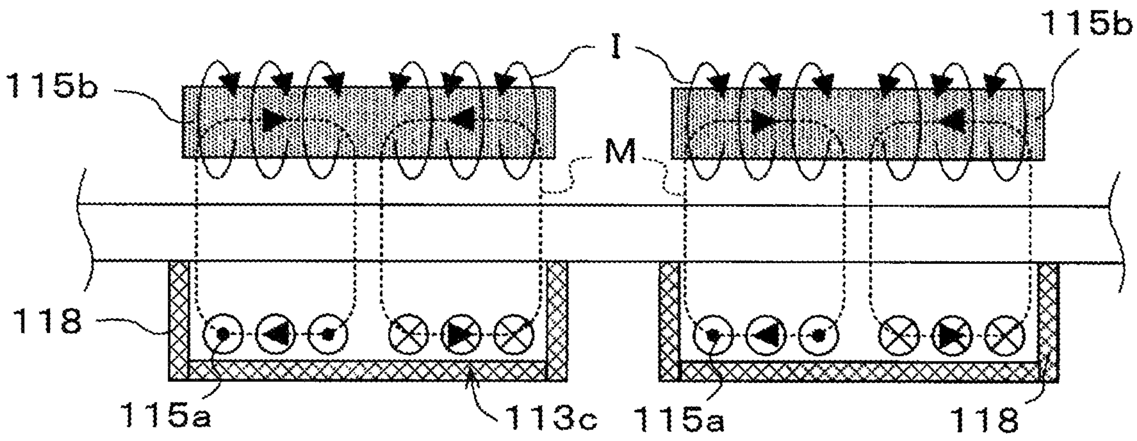
FIG. 12 is a vertical sectional view illustrating still another configuration example of the heating mechanism.

Further, as illustrated in FIG. 12, the magnetic shield 118 may be further provided along a bottom surface of the recess portion 113*c* of the base 113. By providing the magnetic shield 118 along the bottom surface of the recess portion 113*c* in this manner, the emission of the induction magnetic field M downward from the induction heating coil 115*a* is reduced, and the dielectric heating of the conductor provided at the lower portion of the electrostatic chuck 114 is reduced.

Further, a part of the induction magnetic field M emitted downward from the induction heating coil 115*a* is reflected upward (on a side of the magnetic substance 115*b*). Accordingly, a directivity of the induction magnetic field M toward the magnetic substance 115*b* can be improved, and heating efficiency of the magnetic substance 115*b* (the substrate W) can be improved.

In the embodiment, the magnetic shield 118 is provided to the side and/or the lower side of the induction heating coil 115*a*, and in particular, the directivity of the induction magnetic field M with respect to the upper side is improved. Meanwhile, for example, in a case where it is desired to improve the directivity of the induction magnetic field M with respect to another direction, the installation position of the magnetic shield 118 may be appropriately changed.

In the above embodiment, as illustrated in FIG. 7, the heating mechanism 115 is configured such that the plurality of induction heating coils 115*a* and magnetic substances 115*b* are disposed side by side inside the surface of the substrate support 11. Meanwhile, the configuration of the heating mechanism 115 is not limited thereto.

Figure 13:
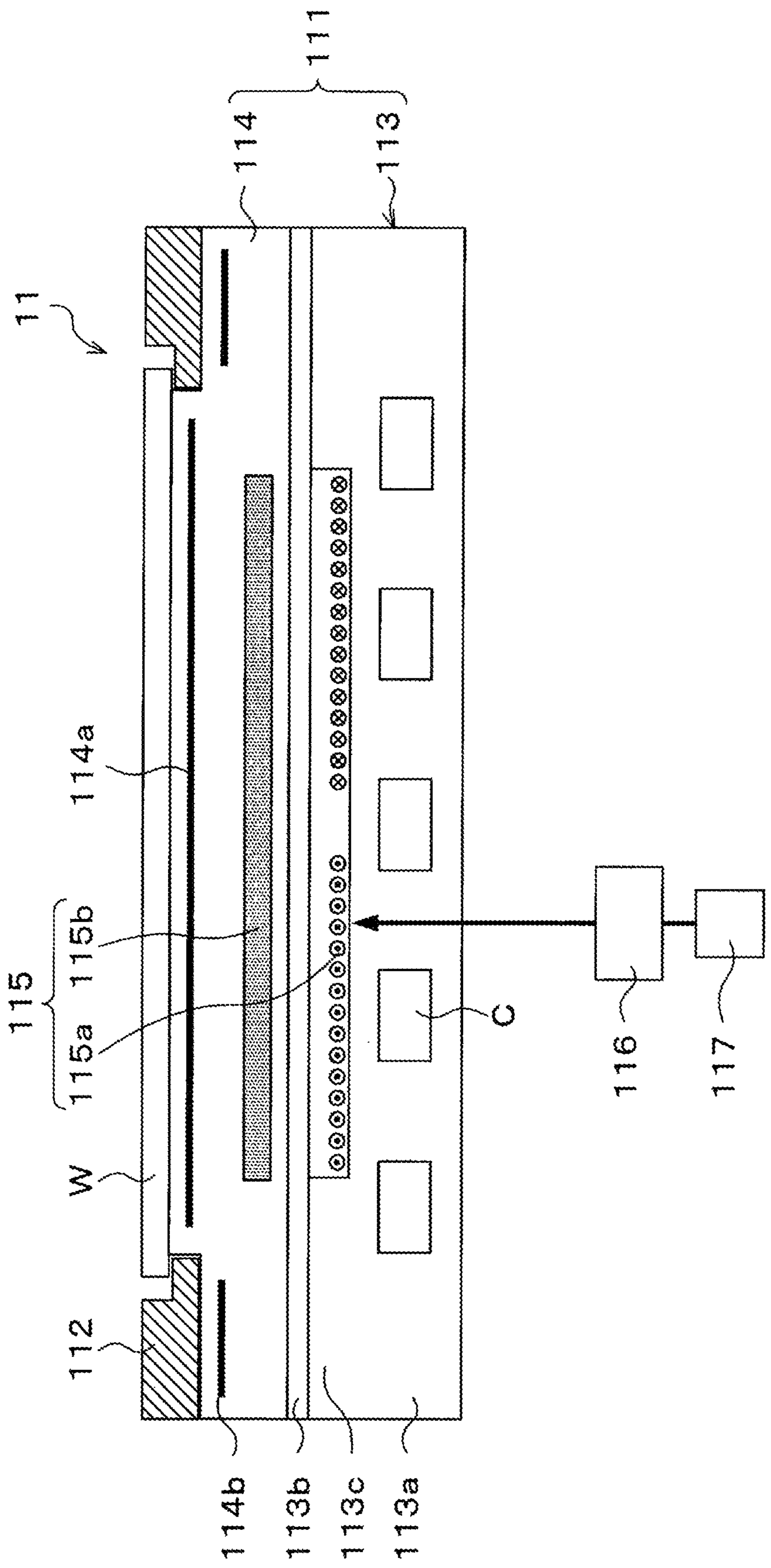
FIG. 13 is a vertical sectional view illustrating a configuration example of a substrate support according to another embodiment.

Specifically, for example, as illustrated in FIG. 13, only one induction heating coil 115*a* and one magnetic substance 115*b* may be disposed to have sizes such that the entire surface of the substrate W can be heated. Even in this case, since it is not necessary to connect the induction heating coil 115*a* and the magnetic substance 115*b* with a power feeding cable or the like, the installation of the RF cut filter can be omitted, and the occupation of the lower space of the substrate support 11 (the electrostatic chuck 114) can be reduced. Further, since the connection by the power feeding cable or the like is omitted in this manner, it is possible to reduce the radio-frequency wave applied from the RF power source 31 to the substrate support 11 from entering a wiring system of the heating mechanism 115 as a noise component.

Meanwhile, in a case where only one induction heating coil 115*a* and one magnetic substance 115*b* are provided inside the surface of the substrate support 11, the in-plane temperature distribution of the substrate W cannot be controlled for each temperature control region as described above. From this viewpoint, it is preferable that the plurality of induction heating coils 115*a* and magnetic substances 115*b* as possible are disposed side by side inside the surface of the substrate support 11.

As described above, in the present embodiment, since the power feeding cable is omitted, even in a case where the installation of the RF cut filter is omitted, it is possible to reduce the radio-frequency waves caused by plasma from entering the wiring system of the heating mechanism 115 as noise components. Meanwhile, in a case where the installation of the RF cut filter is omitted in this manner, even when the introduction of the radio-frequency waves caused by plasma can be reduced, the noise components caused by parasitic capacitance may enter the wiring system of the heating mechanism 115. Therefore, the substrate support 11 may be provided with a filter (not illustrated) for removing the noise components caused by such parasitic capacitance.

In the above embodiment, as illustrated in FIG. 2 or FIG. 4, the plurality of magnetic substances 115*b* are disposed to correspond to the plurality of induction heating coils 115*a* on a one-to-one basis in the surface of the substrate support 11. In other words, the induction heating coils 115*a* and the magnetic substances 115*b* are installed in the same number inside the surface of the substrate support 11. Meanwhile, the number of the installed induction heating coils 115*a* and magnetic substances 115*b* are not limited thereto.

Figure 14:
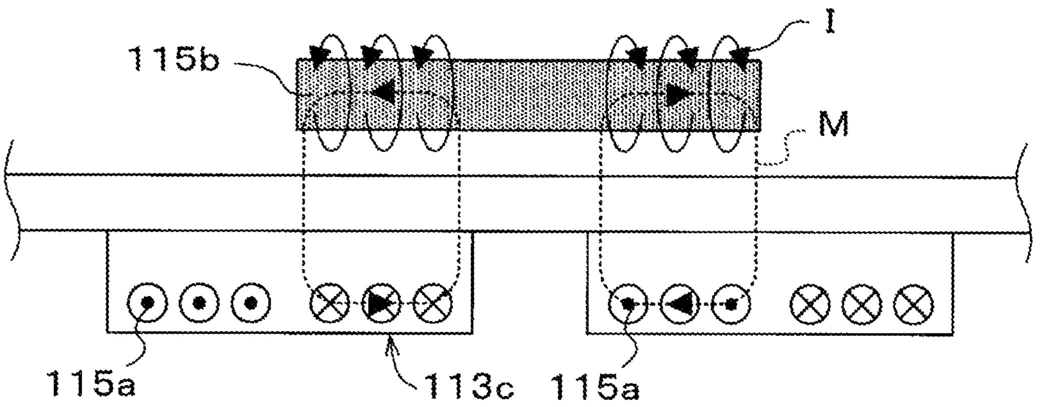
FIG. 14 is a vertical sectional view illustrating still another configuration example of the heating mechanism.

Specifically, for example, as illustrated in FIG. 14, one magnetic substance 115*b* may be inductively heated by the plurality of (two in the illustrated example) induction heating coils 115*a*. Accordingly, the number of the magnetic substances 115*b* disposed in the substrate support 11 can be reduced, and a cost for installing the heating mechanism 115 can be reduced.

In the above embodiment, the induction heating coil 115*a* is formed of a coil member having a circular shape in the plan view, and the magnetic substance 115*b* is formed of a plate member having a rectangular shape in the plan view, respectively. Meanwhile, the shapes of the induction heating coil 115*a* and the magnetic substance 115*b* are not limited thereto, as long as the magnetic substance 115*b* can generate heat by induction heating. That is, for example, the induction heating coil 115*a* may be formed in a rectangular shape in the plan view, or may be made of a plate member. Further, for example, the magnetic substance 115*b* may be formed in a circular shape in the plan view, or may be made of a coil member. In addition, a shape of the recess portion 113*c* formed in the upper surface of the base 113 is not particularly limited, and may be appropriately changed to dispose the induction heating coil 115*a* inside the recess portion 113*c*.

Figure 15:
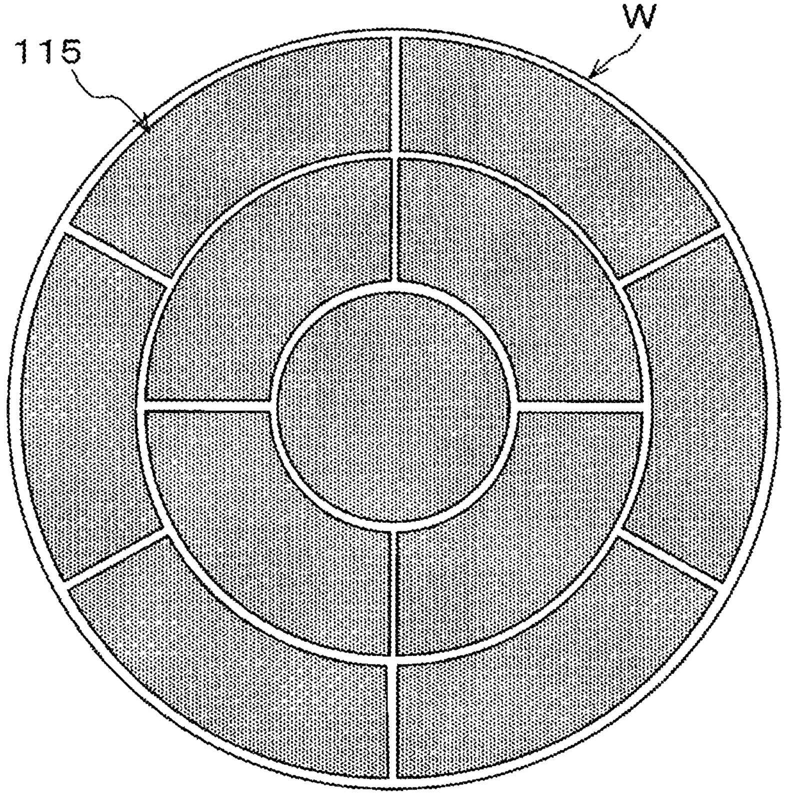
FIG. 15 is a schematic cross-sectional diagram illustrating still another disposition example of the heating mechanism.
Figure 16:
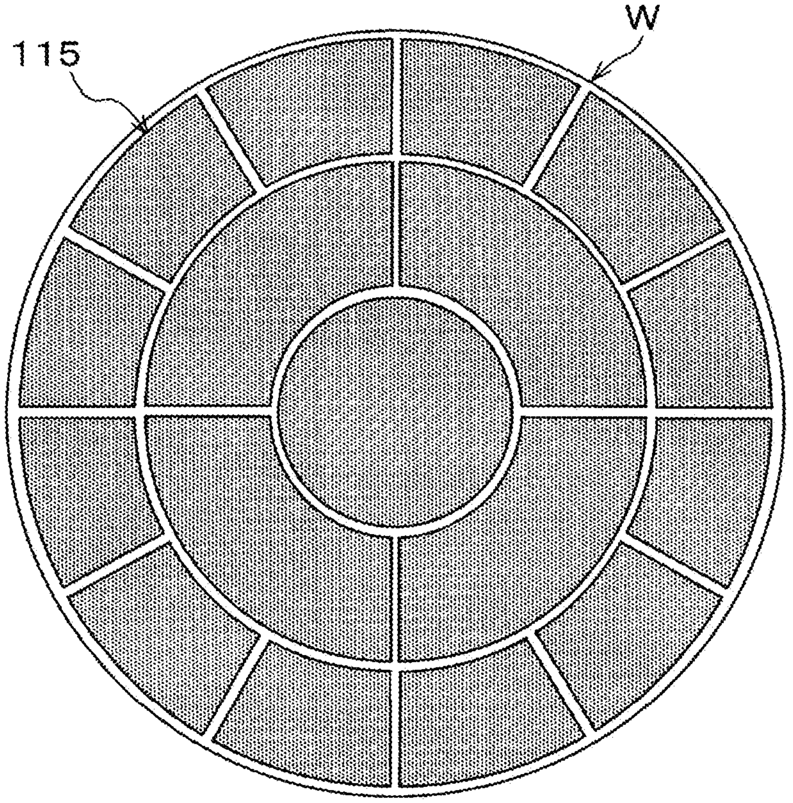
FIG. 16 is a schematic cross-sectional diagram illustrating still another disposition example of the heating mechanism.

Further, for example, the heating mechanism 115 (the induction heating coil 115*a* and the magnetic substance 115*b*) may be disposed concentrically with the substrate support 11 in the plan view. In this case, for example, as illustrated in FIG. 15, the disposition may be determined such that an area of the temperature control region by each heating mechanism 115 is substantially equal to each other. Further, for example, in a case where there is a temperature control region to be particularly controlled finely (in the illustrated example, an outside in a radial direction of the substrate W), the area of each temperature control region may be changed, as illustrated in FIG. 16.

In this manner, the induction heating coil 115*a* and the magnetic substance 115*b* can be configured in any shape. Meanwhile, from the viewpoint of uniformly adjusting the in-plane temperature of the electrostatic chuck 114 (the substrate W), it is preferable that the shapes of the induction heating coil 115*a* and the magnetic substance 115*b* be formed in a shape (for example, a rectangular disposition or a honeycomb disposition) with which the induction heating coil 115*a* and the magnetic substance 115*b* can be evenly laid on the entire surface of the electrostatic chuck 114 (the substrate W).

Figure 17:
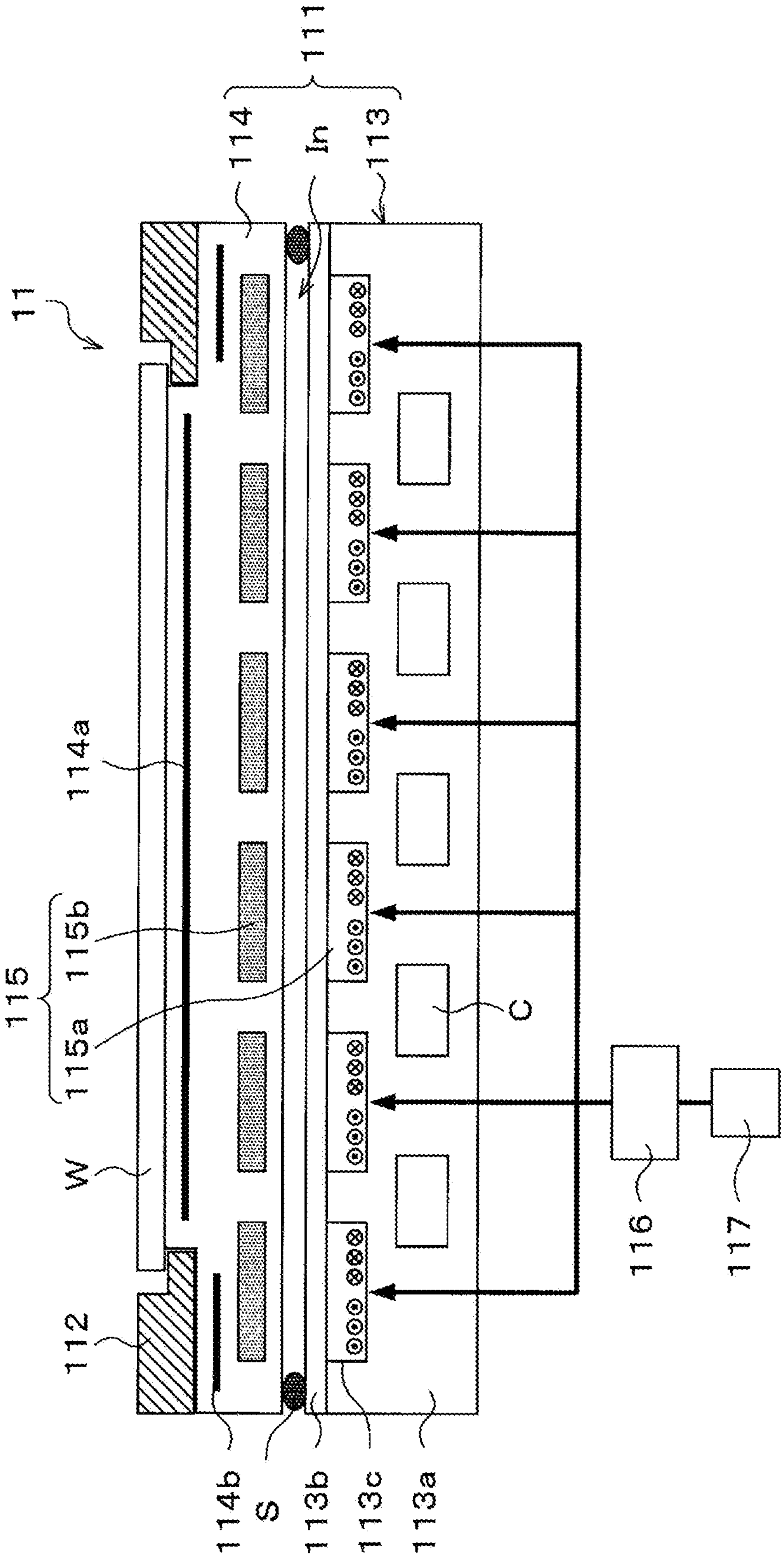
FIG. 17 is a vertical sectional view illustrating a configuration example of a substrate support according to another embodiment.

In the above embodiment, the base 113 and the electrostatic chuck 114 constituting the main body member 111 of the substrate support 11 are directly stacked to each other. Meanwhile, as illustrated in FIG. 17, a heat insulating layer In may be formed between the base 113 and the electrostatic chuck 114. The heat insulating layer In may be configured with, for example, a vacuum heat insulating space formed by providing a sealing member S between the base 113 and the electrostatic chuck 114 as illustrated in FIG. 17, or may be configured by, for example, providing any heat insulating member between the base 113 and the electrostatic chuck 114 (not illustrated).

In this manner, by forming the heat insulating layer In in the main body member 111 of the substrate support 11, the base 113 and the electrostatic chuck 114 are thermally separated from each other. Accordingly, the heat transfer between the electrostatic chuck 114 of which the temperature is raised by the induction heating and the base 113 is reduced. That is, the electrostatic chuck 114 (the substrate W) can be more efficiently heated with the magnetic substance 115*b*.

In a case where the heat insulating layer In is configured with a vacuum heat insulating space as illustrated in FIG. 17, a heat transfer fluid (for example, brine or gas) may be allowed to flow through the vacuum heat insulating space. In other words, a fluid supply (not illustrated) that supplies a heat transfer fluid to the vacuum heat insulating space and a fluid exhausting portion (not illustrated) that exhausts the heat transfer fluid from the vacuum heat insulating space may be connected to the vacuum heat insulating space.

In this case, for example, in a case where the heat transfer fluid does not flow through the vacuum heat insulating space (the heat insulating layer In is in a vacuum state), the base 113 and the electrostatic chuck 114 are thermally separated from each other, and the electrostatic chuck 114 (the substrate W) can be efficiently heated by the heat generation of the magnetic substance 115*b*.

Meanwhile, for example, in a case where the heat transfer fluid flows through the vacuum heat insulating space, the base 113 and the electrostatic chuck 114 are thermally connected to each other by the heat transfer fluid. That is, heat transfer is generated from the heated electrostatic chuck 114 to the base 113 via the heat transfer fluid, so that the electrostatic chuck 114 can be cooled.

When the heat transfer fluid is configured to flow through the vacuum heat insulating space in this manner, by controlling the flow of the heat transfer fluid, in addition to the heating for adjusting the temperature of the electrostatic chuck 114, the cooling can be more appropriately performed. Accordingly, the surface temperature of the electrostatic chuck 114 (the temperature of the substrate W) can be adjusted more appropriately, that is, the plasma processing can be executed more appropriately on the substrate W.

It shall be understood that the embodiments disclosed herein are illustrative and are not restrictive in all aspects. The embodiment described above may be omitted, replaced, or modified in various forms without departing from the scope and spirit of the appended claims.

What is claimed is:

1. A lower electrode mechanism for plasma processing, the lower electrode mechanism comprising:
- a base to which radio-frequency power is applied during the plasma processing;
- a dielectric portion disposed at an upper surface of the base ; and
- an induction heating mechanism,
- wherein the induction heating mechanism includes:
  - an induction heating element heated by an induction magnetic field; and
  - a magnetic field generator that is disposed inside the base and generates the induction magnetic field.

2. The lower electrode mechanism according to claim 1, wherein the base includes: a main body member made of a nonmagnetic electrically conductive member, and having a recess portion, in which the magnetic field generator is accommodated, formed at an upper surface of the main body member; and a lid member made of a nonmagnetic electrically conductive member, and disposed on the upper surface of the main body member to form a ceiling surface of the recess portion, and wherein the lid member transmits the induction magnetic field generated from the magnetic field generator.

3. The lower electrode mechanism according to claim 1, wherein the base includes: a main body member made of a nonmagnetic electrically conductive member; and a lid member made of a nonmagnetic electrically conductive member, the lid member disposed on an upper surface of the main body member, the lid member having a recess portion in which the magnetic field generator is accommodated, the recess portion formed at a lower surface of the lid member, and wherein the lid member transmits the induction magnetic field generated from the magnetic field generator.

4. The lower electrode mechanism according to claim 2, wherein the main body member and the lid member are integrally configured.

5. The lower electrode mechanism according to claim 2, wherein the induction heating element is disposed on an upper surface of the lid member.

6. The lower electrode mechanism according to claim 1, wherein the induction heating element is disposed inside the dielectric portion.

7. The lower electrode mechanism according to claim 1, wherein in a plan view, the induction heating element is disposed such that at least a part of the induction heating element overlaps with the magnetic field generator.

8. The lower electrode mechanism according to claim 7, wherein in the plan view, the induction heating element is disposed such that an entire surface of the induction heating element overlaps with the magnetic field generator.

9. The lower electrode mechanism according to claim 1, wherein the induction heating element is formed of a plate member or a coil member.

10. The lower electrode mechanism according to claim 1, wherein the induction heating element is made of an iron-containing material containing any of carbon steel, silicon iron, stainless steel, permalloy, and ferrite, or at least one of aluminum, tungsten, tin, titanium, carbon, silicon, and silicon carbide.

11. The lower electrode mechanism according to claim 1, wherein the dielectric portion is made of a nonmagnetic dielectric member.

12. The lower electrode mechanism according to claim 1, wherein the induction heating mechanism heats at least the dielectric portion, includes a plurality of the induction heating elements and a plurality of the magnetic field generators, and is configured to independently heat the dielectric portion for each of a plurality of predetermined temperature control regions.

13. The lower electrode mechanism according to claim 12, wherein the induction heating mechanism is provided with the induction heating elements and the magnetic field generators in the same number such that each one of the magnetic field generators corresponds to one of the induction heating elements.

14. The lower electrode mechanism according to claim 12, wherein the induction heating mechanism is provided such that the plurality of magnetic field generators corresponds to one of the induction heating elements.

15. The lower electrode mechanism according to claim 1, wherein a magnetic shield that reduces transmission of the induction magnetic field is provided to surround the magnetic field generator in a plan view.

16. The lower electrode mechanism according to claim 1, wherein a magnetic shield that reduces transmission of the induction magnetic field is provided below the magnetic field generator.

17. The lower electrode mechanism according to claim 15, wherein the magnetic shield is made of a member having a relative magnetic permeability greater than 1.

18. The lower electrode mechanism according to claim 1, further comprising:

an actuator that causes a part of the magnetic field generator to come close to or separate from the induction heating element.

19. A substrate processing method by a substrate processing apparatus including a processing chamber that defines a processing space for a substrate, a lower electrode mechanism disposed inside the processing space, a gas supply that supplies a processing gas into the processing space, and a plasma generator that generates a plasma in the processing space with the processing gas by supplying radio-frequency power to the lower electrode mechanism, in which the lower electrode mechanism includes a base to which the radio-frequency power is applied when the substrate is processed, an electrostatic chuck disposed on an upper surface of the base and including a support surface for the substrate on an upper surface of the electrostatic chuck, an induction heating element heated by an induction magnetic field, and a magnetic field generator that is disposed inside the portion and generates the induction magnetic field, the substrate processing method comprising: generating an induction magnetic field by supplying a current to the magnetic field generator, and adjusting a temperature of the substrate supported by the lower electrode mechanism with the induction magnetic field; and supplying the processing gas inside the processing chamber, and then supplying the radio-frequency power to the lower electrode mechanism to generate a plasma in the processing space.

20. The substrate processing method according to claim 19, wherein in the adjusting of the temperature of the substrate, an amount of current to be supplied to the magnetic field generator is adjusted based on a difference between an actually measured temperature of the substrate supported by the lower electrode mechanism and a target temperature of the substrate.

* * * * *